United States Patent
Pakulski et al.

(10) Patent No.: US 6,829,275 B2
(45) Date of Patent: Dec. 7, 2004

(54) HYBRID CONFINEMENT LAYERS OF BURIED HETEROSTRUCTURE SEMICONDUCTOR LASER

(75) Inventors: Grzegorz J. Pakulski, Woodlawn (CA); D. Gordon Knight, Munster Hamlet (CA); Cornelis Blaauw, Kanata (CA)

(73) Assignee: Bookham Technology, plc, Abingdon (GB)

( * ) Notice: Subject to any disclaimer, the term of this patent is extended or adjusted under 35 U.S.C. 154(b) by 139 days.

(21) Appl. No.: 10/027,229

(22) Filed: Dec. 20, 2001

(65) Prior Publication Data

US 2003/0119222 A1 Jun. 26, 2003

(51) Int. Cl.$^7$ ............................. H01S 5/00; H01L 21/00
(52) U.S. Cl. .......................................... 372/46; 438/60
(58) Field of Search .............................. 372/45–46, 96; 438/39

(56) References Cited

U.S. PATENT DOCUMENTS

| | | | | |
|---|---|---|---|---|
| 5,452,315 A | * | 9/1995 | Kimura et al. ................ | 372/46 |
| 5,606,572 A | * | 2/1997 | Swirhun et al. .............. | 372/96 |
| 6,287,884 B1 | * | 9/2001 | Jie et al. ........................ | 438/39 |
| 6,323,507 B1 | * | 11/2001 | Yokoyama et al. ........... | 257/79 |
| 6,421,492 B1 | * | 7/2002 | Weber ........................ | 385/131 |
| 6,552,358 B2 | * | 4/2003 | Cho et al. .................... | 257/17 |

FOREIGN PATENT DOCUMENTS

| | | |
|---|---|---|
| EP | 547850 A1 | 6/1993 |
| EP | 1225670 A1 | 7/2002 |
| JP | 01-241886 | 9/1989 |
| JP | 07-022691 | 1/1995 |
| JP | 10-206808 | 8/1998 |
| JP | 11-168261 | 6/1999 |

OTHER PUBLICATIONS

An "Monolithic integration of ingaasp/inp lasers and heterostructure bipolar transistors by selective area epitaxy." *Electronic Letters*, 1993;29(8):645–6.
Pakulski et al. "Semi–insulating buried heterostructure laser with PN fence." *Electronic Letters*, 2002; 38(25): 1680–2.

* cited by examiner

*Primary Examiner*—Don Wong
*Assistant Examiner*—Hung Tran Vy
(74) *Attorney, Agent, or Firm*—Lahive & Cockfield, LLP; Anthony A. Laurentano, Esq.

(57) ABSTRACT

A semiconductor device such as a buried heterostructure semiconductor laser includes a semiconductor substrate supporting an active region comprised of a multiple quantum well active region and confinement layers having defined gratings and grating overgrowth regions to produce a laser device. The device also includes a current confinement layer including a sequence of doped n-p-n-p semiconductor layers to produce a n-p-n-p blocking structure and a semi-insulating semiconductor material deposited over the n-p-n-p blocking structure.

24 Claims, 5 Drawing Sheets

HYBRID CONFINEMENT LAYERS OF BURIED HETEROSTRUCTURE SEMICONDUCTOR LASER

BACKGROUND

This invention relates generally to semiconductor devices and more particularly to heterostructure semiconductor lasers.

Heterostructure semiconductor lasers have current blocking layers to isolate active regions of the laser. The most common approach to produce a current blocking layer for the buried heterostructure laser is to include extensive reversed biased p-n junctions to act as the blocking layer. However, extensive reversed biased p-n junctions have high capacitance characteristics that contribute to the total capacitance of the laser. The capacitance of the laser is one of the limiting factors for the rate of modulation in the active layer. To reduce this capacitance, isolation channels are often formed parallel to the active layer structure to reduce the size of the p-n regions. However, these isolation channels or trenches tend to inhibit heat removal from the active layer.

SUMMARY

According to an aspect of the present invention, a method of fabricating a buried heterostructure semiconductor device includes producing a hybrid current confinement region adjacent to active layers of the device, by disposing a sequence of the p-n-p layers surrounding the active layer; and disposing a semi-insulating material around the p-n-p layers surrounding the active layers.

According to an additional aspect of the invention a semiconductor device includes a semiconductor substrate supporting an active region comprised of a multiple quantum well active regions and confinement layers having defined gratings and grating overgrowth regions to produce a laser device. The device also includes a current confinement layer including a sequence of doped n-p-n-p semiconductor layers to produce a n-p-n-p blocking structure and a semi-insulating semiconductor material over the n-p-n-p blocking structure.

One or more of the following advantages may be provided by one or more aspects of the invention.

The present invention introduces a hybrid current confinement for buried heterostructure (BH) semiconductor lasers. The hybrid current confinement structure includes a current blocking arrangement adjacent to the active layer. The current blocking arrangement is accomplished by a sequence of p-n-p-n layers. Further away from the active layer, a semi-insulating material (InP:Fe in this case) is used to provide current confinement for the active layer.

This arrangement has several advantages over existing approaches. The active layer is surrounded by a p-n-p-n layer sequence and therefore there is no inter-diffusion of dopants from the semi-insulating layer and active layer, e.g., Zn and Fe. This ensures a minimum of non-radiative centers in the active layer. The invention allows the lateral dimension (extent from the active layer) of the n-p-n-p blocking layers to be minimized. This results in a low parasitic capacitance of the laser and low leakage current. In some embodiments, the Fe doped semi-insulating material is grown last (nothing is grown on top of this layer), and hence the inter-diffusion of Zn and Fe is very limited. If inter-diffusion is present, it occurs away from the active region. The provision of the semi-insulating layer eliminates the need for isolation channels (trenches) parallel to the active layer to electrically isolate the active region. Isolation is now provided by the re-grown semi-insulating layer InP:Fe.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
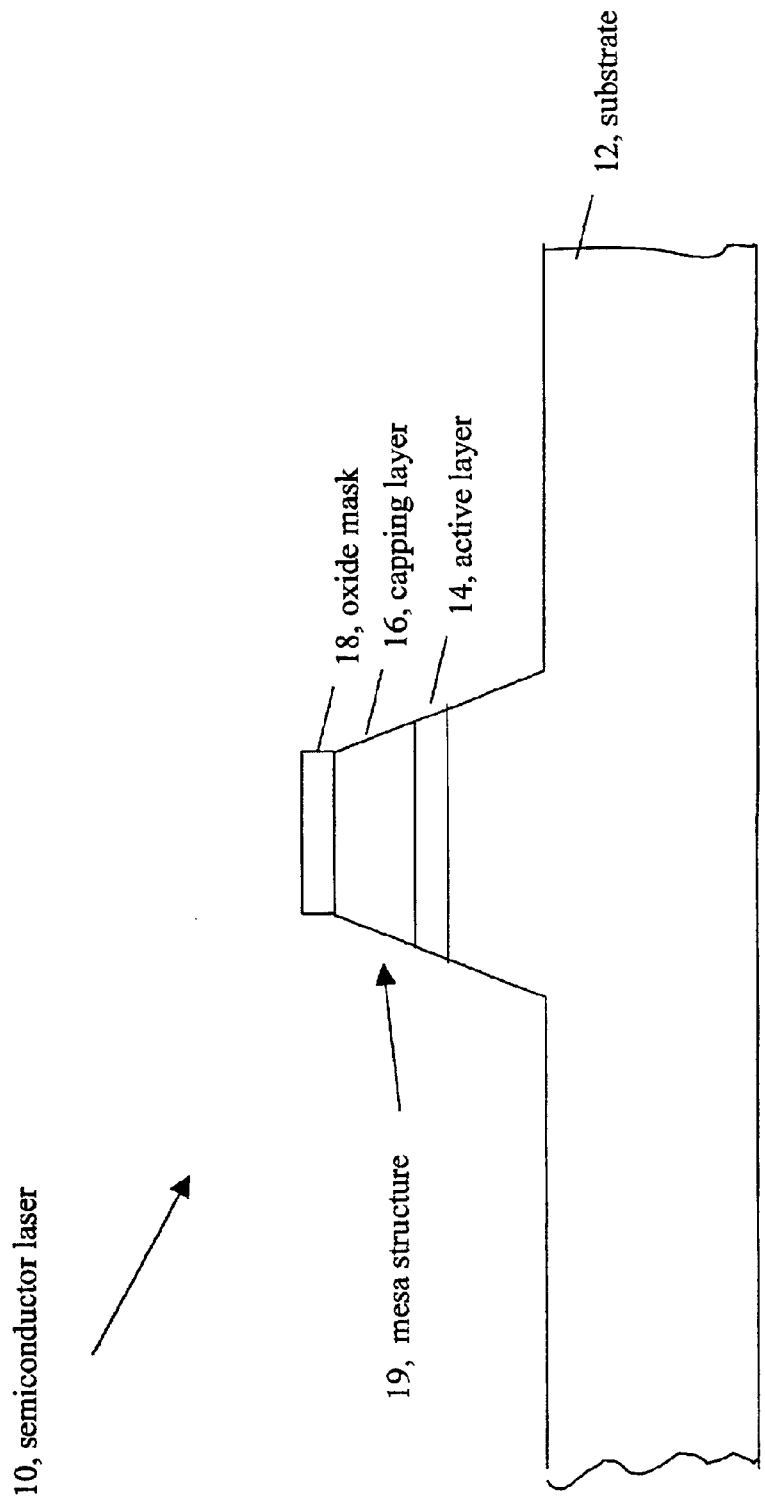
FIGS. 1–5 are cross-sectional views that show stages of fabrication of a heterostructure semiconductor laser incorporating a hybrid confinement layer.

Referring to FIG. 1, a heterostructure semiconductor laser device 10 in early stages of fabrication is shown. The semiconductor laser device 10 includes a substrate region 12 comprised of a semiconductor material of suitable bandgap energy for the desired wavelength. One example is indium phosphide (InP). The InP substrate 12 is doped with an n-type dopant e.g., silicon (Si). The semiconductor substrate 12 is typically doped to a concentration of 1–2 *10 18cm−3. Provided on the semiconductor substrate layer 12 is an active layer 14 that is comprised of multiple quantum well active regions or bulk active regions and confinement layers (not shown). The device 10 also may include gratings (not shown), which are etched into the guiding layer (not shown), adjacent to the active layer, or into the active layer. After grating patterning, the surface with gratings is subsequently overgrown, e.g. with InP, using standard crystal growth techniques.

A capping layer 16 is formed e.g., deposited, and so forth over the active layer 14. In general, conventional processes are used for forming the active layer structure 14 of the semiconductor laser.

A masking layer is patterned to leave oxide-masking regions, e.g., 18 that are used for mesa formation. In a practical situation, many mesas with active regions are provided from a single substrate. In regions where an active layer is produced, a layer of masking material (not shown) such as silicon dioxide is deposited over the capping layer 16 and is patterned to provide mask region 18. An etchant is applied over the structure 10 to etch the structure into a mesa structure 19 housing the active layer 14, as shown. Any suitable etching technique may be used such as a dry or wet chemical etch. Generally, an anisotropic etch is used to etch in a preferentially vertical dimension more than a horizontal dimension.

Figure 2:
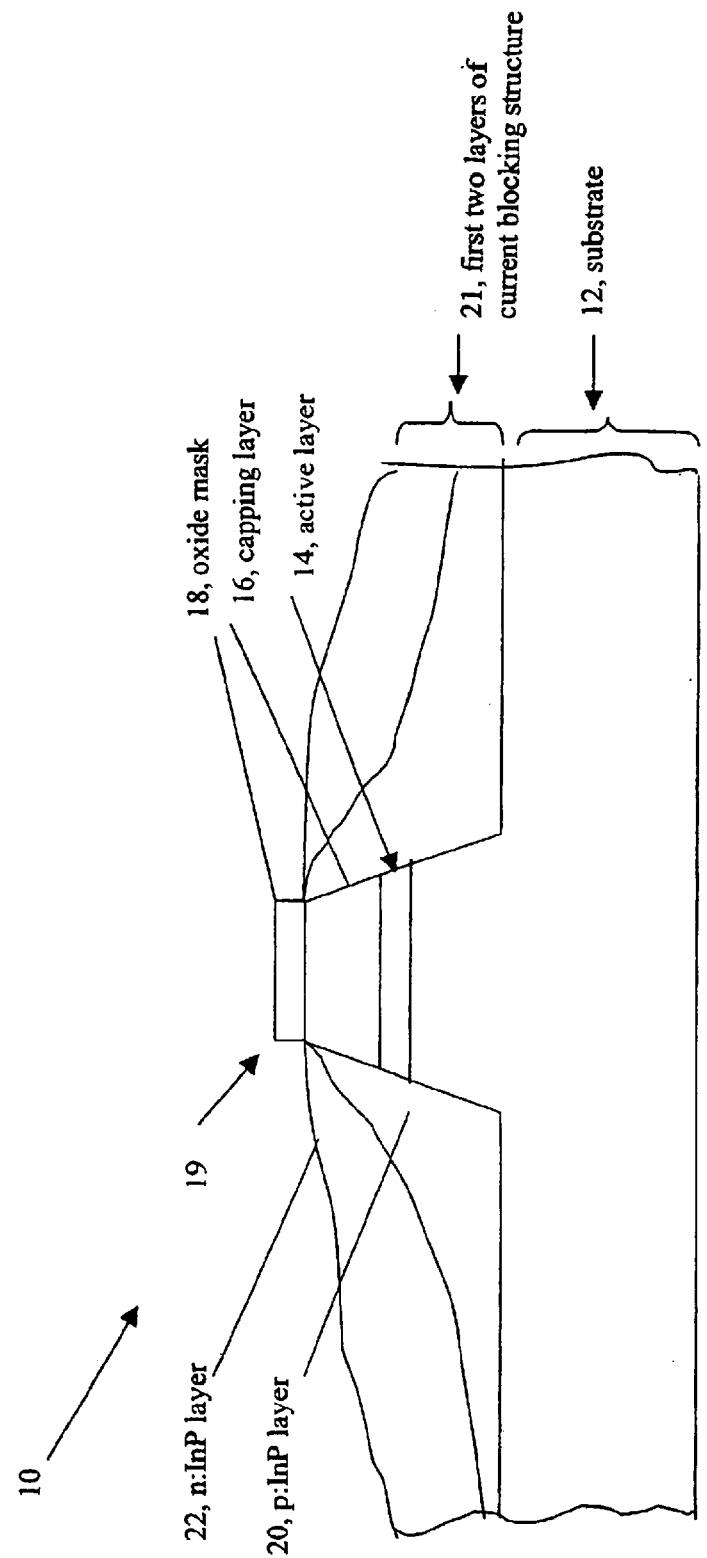

Referring to FIG. 2, after producing the mesa structure 19 with the oxide mask 18 still over the mesa structure 19, the first two layers of a p-n-p current blocking structure 21 are selectively grown around the active region using conventional techniques. For example, a layer 20 of InP having a p-type dopant such as zinc (Zn) is formed over side walls of the mesa structure 19 and over the substrate layer 12 of n-type InP. The n-type InP layer 22 is disposed, e.g., deposited using any suitable technique over the p-type layer. After formation of the current blocking structure, the oxide masking layer 18 is removed.

Figure 3:
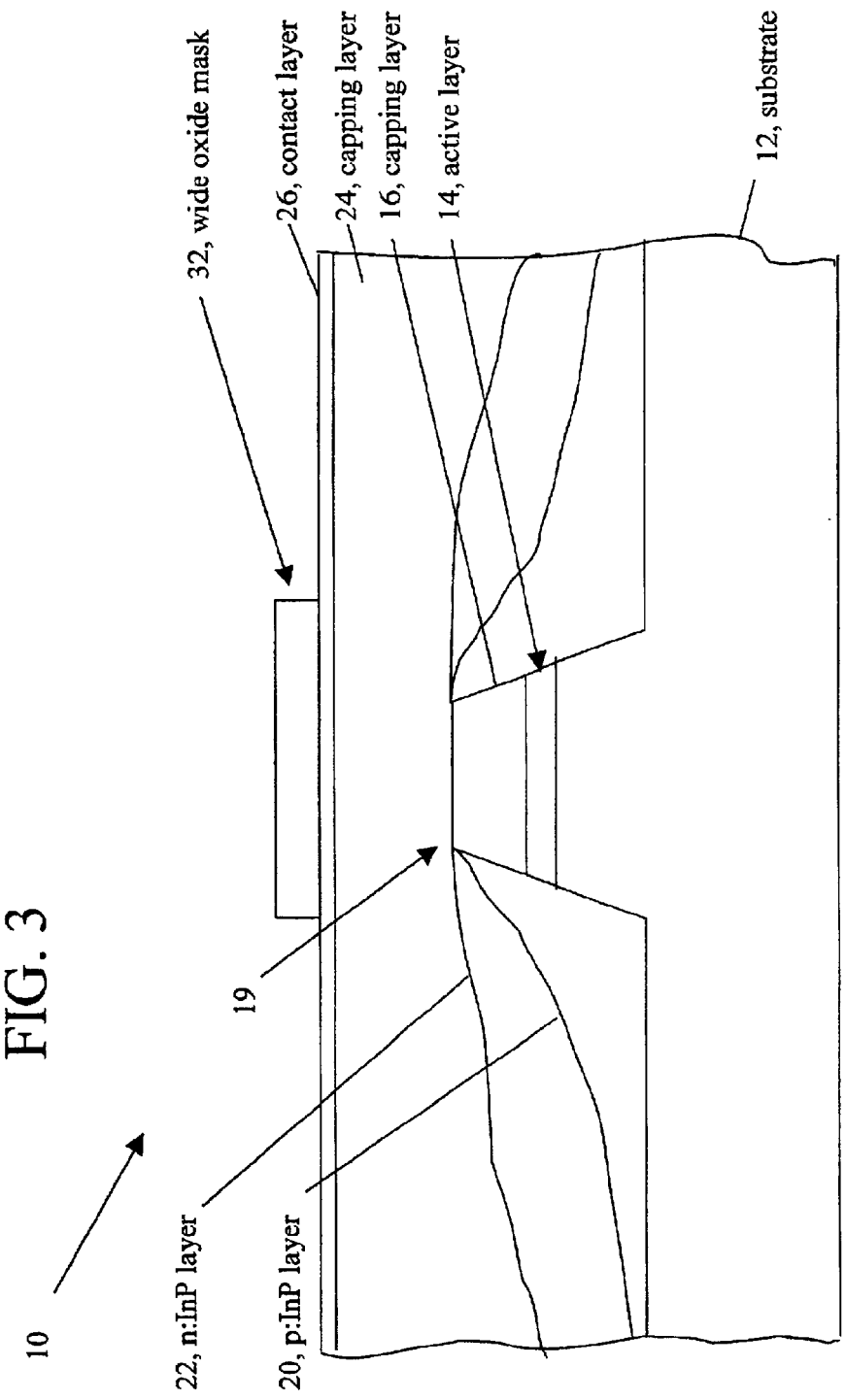

Referring to FIG. 3, after stripping of the oxide masking layer 18 (FIG. 2), a second p-type InP capping layer 24 and a p+-type contact layer 26 are deposited over the mesa structure 19. The p-type layer 24 is InP doped with, for example, zinc, whereas the contact layer can be more heavily doped InP or preferably is p+type doped InGaAs, providing the structure shown in FIG. 3. A masking layer (not shown) is patterned to leave the wide oxide-masking layer 32 over the mesa 19, after the formation of the above layers.

Figure 4:
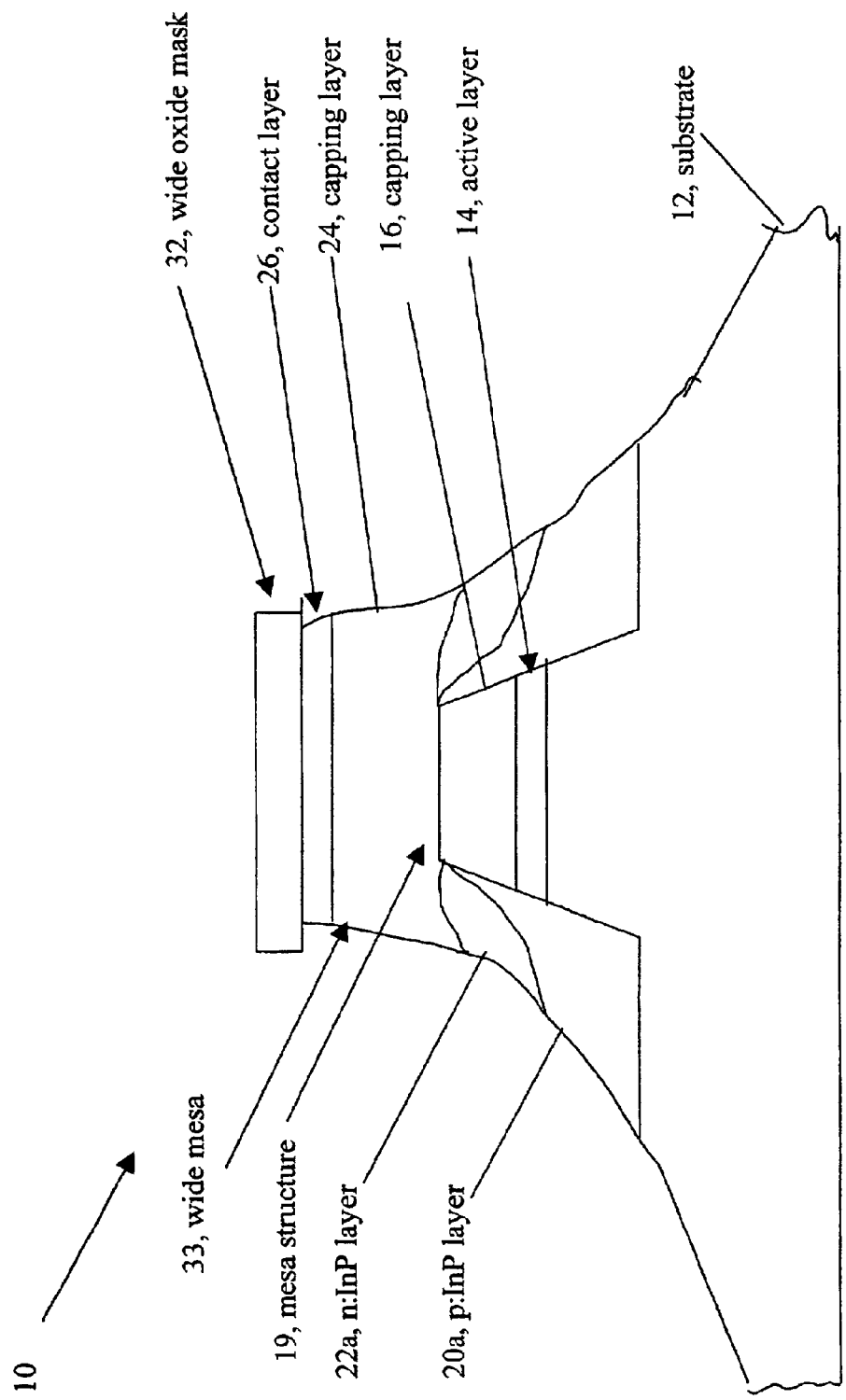

Referring to FIG. 4, portions of the p-type InP capping layer 24 and contact layer 26 are etched away to leave a region covering the original mesa 19. Also, regions of the p and n layers 20 and 22 are etched away leaving p-n layers 20a and 22a respectively, as shown in FIG. 4. This etched structure forms the wide mesa 33. The resulting n-p-n-p layers form p-n junctions that surround and enclose the active layer 14.

Figure 5:
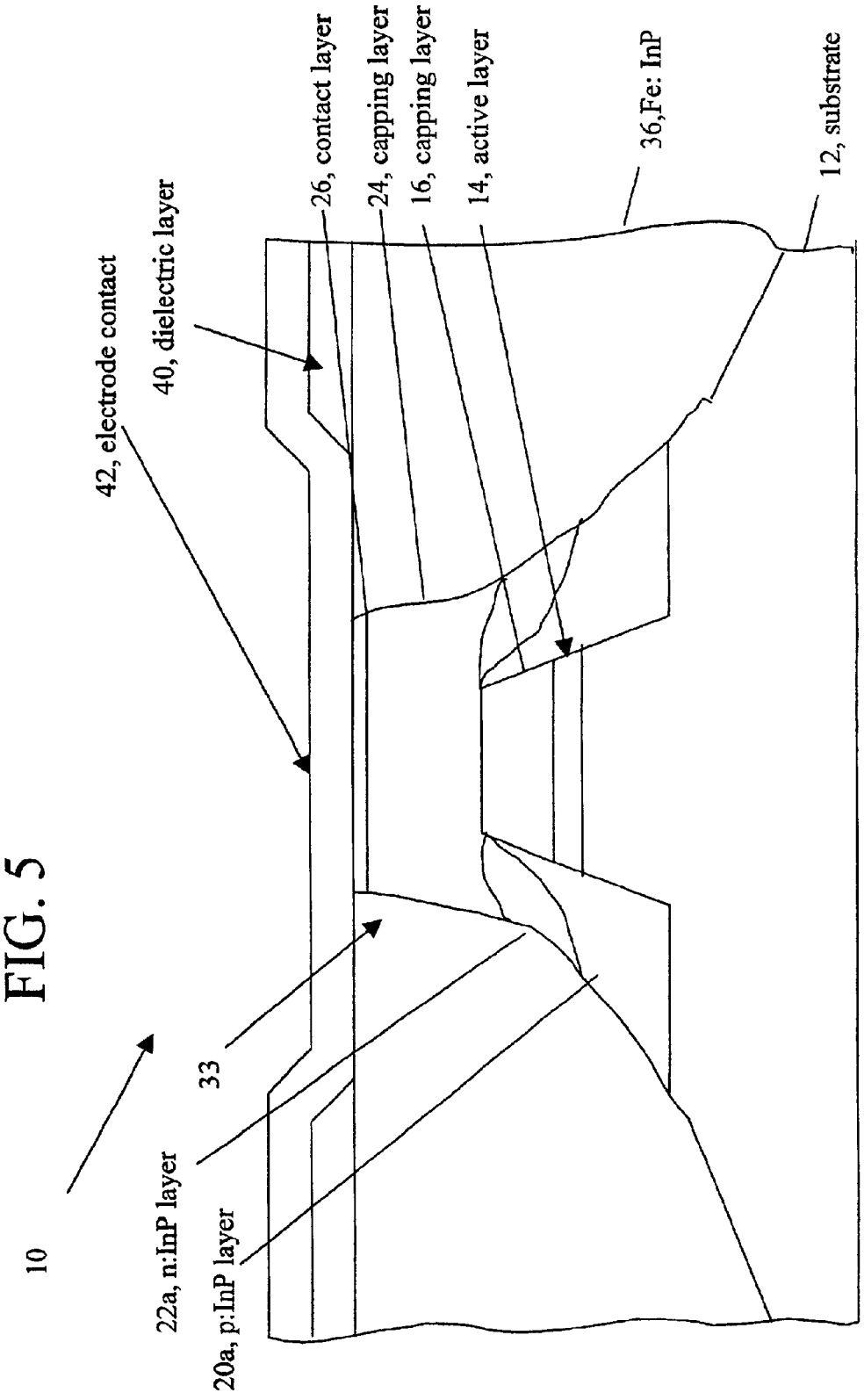

Referring to FIG. 5, after etching of the p-n-p-n layers, the removed material is replaced with semi-insulating, re-grown material 36 such as Fe doped InP using conventional epitaxial growth techniques. The wide oxide mask is then stripped, leaving the InP semi-insulating regions providing a second confinement region about the wide mesa 33 and active layer 14. The n-p-n-p layers that form the p-n junctions, which surround and enclose the active layer 14, and the InP semi-insulating regions 36 provide a hybrid current confinement arrangement. A dielectric layer 40 of silicon dioxide and silicon nitride and metal electrode 42 are deposited over the p+ contact layer 26 and the InP semi-insulating regions 36.

The structure 10 has several advantages over existing approaches. The active layer 14 is surrounded by the p-n-p-n layer sequence and the semi insulating InP 36. An alternative approach to the blocking layer could be to merely re-grow semi-insulating material around the mesa. Such a buried heterostructure laser employing a high resistivity semi-insulating layer would not suffer from high junction capacitance. However, such a buried heterostructure laser adopting the Fe-doped InP as the confinement layer would place Fe close to the active region. If the Fe-doped InP material is placed in close proximity to the active region, it is likely that the Fe-doped InP adjacent to the active region would be converted to a conductive p-type layer. Such a conversion could occur by out-diffusion of zinc (p-dopant) from the p-InP active region during re-growth of Fe-doped InP or the p-doped capping and contact layers. This converted conductive layer would provide a current shorting path, so that not all of the applied current passes usefully through the active layer of the laser. In addition, out-diffusion of zinc is always accompanied by Fe diffusion in the opposite direction, i.e., into the p-doped cladding and the active layer. This can pose a problem, especially in the active layer, where Fe atoms create non-radiative recombination centers.

The combination of the p-n junctions close to the active layer and semi-insulating material further away from the active layer mitigates the possibility of Fe diffusion into the active layer 14. The active layer 14 is surrounded by the p-n-p-n layer sequence and therefore there is no inter-diffusion of Zn and Fe in the active layer or in the vicinity of the active layer. This reduces the number of non-radiative centers in the active layer. The hybrid approach allows the lateral dimension (extent from the active layer) of the p-n-p-n blocking layers to be minimized. This results in a low parasitic capacitance of the laser and low leakage current. The Fe doped material is grown last (nothing is grown on top of this layer), hence the inter-diffusion of Zn and Fe is very limited and, if still present, it occurs away from the active region.

The hybrid current confinement for the buried heterostructure (BH) semiconductor lasers provides current blocking adjacent to the active layer resulting from the sequence of p-n-p layers. Further away from the active layer, the semi-insulating material (InP:Fe in this case) is used to provide current confinement.

The approach can be used with directly modulated BH lasers. In particular, it significantly lowers the laser's parasitic capacitance without reducing heat escape from the active layer. With the hybrid confinement layer the laser can be used at higher transmission speeds (>=10 GB/s) and higher operating temperature. This is particularly advantageous in a coolerless (10 GB/s) directly modulated laser.

A number of embodiments of the invention have been described. Nevertheless, it will be understood that various modifications may be made without departing from the spirit and scope of the invention. Accordingly, other embodiments are within the scope of the following claims.

What is claimed is:

1. A method of fabricating a buried heterostructure semiconductor device, comprising:
producing a hybrid current confinement region adjacent to an active layer of the device, by:
disposing in a selected sequence adjacent to selected surface portions of the active layer, a layer of first material doped with a first dopant and a layer of second material doped with a second dopant; and
disposing a semi-insulating material adjacent to the layers of the first and second materials; and
disposing a layer of dielectric material directly on the semi-insulating material, wherein the arrangement of the disposed materials produces the hybrid current confinement region during fabrication of the buried heterostructure semiconductor device.

2. The method of claim 1, wherein the semiconductor device is a buried heterostructure laser.

3. The method of claim 1, wherein the semi-insulating material comprises InP to provide current confinement for current generated in the active layer.

4. The method of claim 3, wherein the semi-insulating material is doped with Fe.

5. The method of claim 1, further comprising a step of:
depositing a capping layer over a first mesa to form a current blocking structure, wherein the first mesa supporting the active layer.

6. The method of claim 5, further comprising a step of etching portions of the current blocking structure to form a second mesa covering the first mesa.

7. The method of claim 6, further comprising a step of forming a semi-insulating material over the etched blocking structure.

8. The method of claim 1 further comprising:
depositing a contact layer over the first and second layers.

9. The method of claim 8 further comprising:
forming a contact electrode directly on the contact layer, the semi-insulating material and the dielectric layer.

10. The method of claim 1, wherein at least one of the first and second materials directly contacts the selected surface portions of the active layer.

11. The method of claim 1, wherein the first and second dopants include p-type and n-type dopants, respectively.

12. The method of claim 1, wherein the first and second dopants include n-type and p-type dopants, respectively.

13. A semiconductor device comprising:
substrate supporting an active layer and
a current confinement layer comprising:
first and second semiconductor layers adjacent to selected wall surfaces of the active layer to produce a blocking structure, wherein the first and second layers are doped with first and second dopants, respectively;

a semi-insulating semiconductor material adjacent to the blocking structure; and a dielectric layer disposed directly on the semi-insulating material.

14. The semiconductor device of claim 13 further comprising:

a heavily doped contact layer disposed over the active layer.

15. The semiconductor device of claim 14 wherein the contact layer comprises p-type InGaAs.

16. The semiconductor device of claim 13 wherein the semi-insulating material comprises InP.

17. The semiconductor device of claim 16, wherein the semi-insulating material is doped with Fe.

18. The semiconductor device of claim 13 wherein the semiconductor substrate material comprises InP.

19. The semiconductor device of claim 18, wherein the semiconductor substrate material is doped with an n-type dopant.

20. The semiconductor device of claim 13 further comprising:

a heavily doped contact layer disposed over the blocking structure.

21. The semiconductor device of claim 20 further comprising:

a contact electrode provided directly on the contact layer, the semi-insulating material and the dielectric layer.

22. The semiconductor device of claim 13, wherein the first and second dopants include p-type and n-type dopants, respectively.

23. The semiconductor device of claim 13, wherein the first and second dopants include n-type and p-type dopants, respectively.

24. The semiconductor device of claim 13, wherein the blocking structure includes a p-n blocking structure.

* * * * *